United States Patent
Wu et al.

(10) Patent No.: US 9,000,521 B2
(45) Date of Patent: Apr. 7, 2015

(54) BODY CONTACT SOI TRANSISTOR STRUCTURE AND METHOD OF MAKING

(75) Inventors: Dongping Wu, Shanghai (CN); Shili Zhang, Uppsala (SE)

(73) Assignee: Fudan University, Shanghai (CN)

( * ) Notice: Subject to any disclaimer, the term of this patent is extended or adjusted under 35 U.S.C. 154(b) by 11 days.

(21) Appl. No.: 13/583,923

(22) PCT Filed: Apr. 19, 2011

(86) PCT No.: PCT/CN2011/000679
§ 371 (c)(1),
(2), (4) Date: Sep. 10, 2012

(87) PCT Pub. No.: WO2011/131028
PCT Pub. Date: Oct. 27, 2011

(65) Prior Publication Data
US 2013/0026573 A1    Jan. 31, 2013

(30) Foreign Application Priority Data
Apr. 22, 2010   (CN) ............................ 201010153461

(51) Int. Cl.
| H01L 27/12 | (2006.01) |
| H01L 21/74 | (2006.01) |
| H01L 29/786 | (2006.01) |
| H01L 29/66 | (2006.01) |

(52) U.S. Cl.
CPC ........ *H01L 21/743* (2013.01); *H01L 29/78615* (2013.01); *H01L 29/66772* (2013.01); *H01L 29/78612* (2013.01)

(58) Field of Classification Search
CPC ..... H01L 21/74; H01L 21/743; H01L 21/762; H01L 21/76264; H01L 21/763; H01L 27/1203; H01L 29/78; H01L 29/78615
USPC ............ 257/347, E29.255, E21.409; 438/311
See application file for complete search history.

(56) References Cited

U.S. PATENT DOCUMENTS

| 5,527,723 A * | 6/1996 | Witek et al. .................... 438/212 |
| 7,259,048 B2 * | 8/2007 | Chaudhry et al. ............. 438/156 |
| 8,034,682 B2 * | 10/2011 | Herrick et al. ................ 438/242 |
| 2008/0113474 A1 * | 5/2008 | Lee et al. ...................... 438/151 |
| 2009/0184357 A1 * | 7/2009 | Wu ................................ 257/303 |

FOREIGN PATENT DOCUMENTS

KR    10-2004-0060288    *   7/2004   ............. H01L 21/76

* cited by examiner

*Primary Examiner* — Khiem D Nguyen
(74) *Attorney, Agent, or Firm* — Jamie J. Zheng, Esq.

(57) ABSTRACT

The present invention puts forward a body-contact SOI transistor structure and method of making. The method comprises: forming a hard mask layer on the SOI; etching an opening exposing SOI bottom silicon; wet etching an SOI oxide layer through the opening; depositing a polysilicon layer at the opening followed by anisotropic dry etching; depositing an insulating dielectric layer at the opening followed by planarization; forming a gate stack structure by deposition and etching, and forming source/drain junctions of the transistor using ion implantation. By using the present invention, body contact for SOI field-effect transistors can be effectively formed, thereby eliminating floating-body effect in the SOI field-effect transistors, and improving heat dissipation capability of the SOI transistors and associated integrated circuits.

20 Claims, 7 Drawing Sheets

BODY CONTACT SOI TRANSISTOR STRUCTURE AND METHOD OF MAKING

FIELD

The present invention is related to semiconductor and associated fabrication technologies, and in particular to a body-contact SOI transistor and method of making.

BACKGROUND

In recent years, microelectronic technologies around silicon integrated circuits (IC) have been developing rapidly. The development of integrated circuit chips basically follows Moore's Law, that is, the degree of integration for semiconductor chips increases by doubling every 18 months. But as the semiconductor chip integration continues to increase, MOS channel length is also shortened continually. When the MOS transistor channel length becomes very short, short channel effect causes the semiconductor chip performance to decline, or to even fail entirely. Traditional silicon integrated circuit chips are generally fabricated on bulk silicon.

With the start of 90 nm technologies, semiconductor companies have been manufacturing large-scale integrated circuit chips using silicon-on-insulator (SOI) substrates. The SOI integrated circuit chips have the advantages of strong anti-radiation capabilities, easy isolation between devices, small parasitic capacitance, and strong anti-latch-up capabilities. Also, SOI field-effect transistors are excellent at controlling short channel effects, and have superior miniaturization capabilities compared to transistors built on bulk silicon. Therefore, ultra-thin body silicon SOI substrate and full depletion-type field-effect transistors fabricated thereon have great application prospects in future semiconductor integrated circuits.

At the same time, SOI integrated circuit chips, especially SOI full depletion type field-effect transistor integrated circuit chips, also have attendant shortcomings, including floating-body effect and relatively low heat dissipation capacity. Floating-body effects cause certain memory effects in the field-effect transistors, reducing the reliability of IC operation. Thus, forming highly effective body contact in SOI field-effect transistors is an important subject.

SUMMARY

The present invention intends to solve the technological problems related to how to reduce floating-body effect and enhance heat dissipation capabilities in SOI structures.

To solve these technological problems, the present invention proposes a body-contact SOI transistor structure, including: a first structure filled with an insulating dielectric material after an upper silicon layer and an oxide layer of the SOI are etched; and a polysilicon layer in the SOI oxide layer near the first structure, the polysilicon layer connecting the upper silicon layer of the SOI with bottom silicon of the SOI.

Preferably, the SOI transistor structure further includes a rectangular gate stack structure on a surface of the SOI.

Preferably, the SOI transistor structure further includes a T-shaped gate stack structure on the surface of the SOI. In one embodiment, at the first structure, the T-shaped gate stack structure is made of a horizontal rectangle added to a longitudinal rectangle.

Preferably, the gate stack structure includes at least one gate insulator layer and one gate conductor layer.

Further, the present invention also proposes a method for making a body-contact SOI transistor structure. The method comprises forming a hard mask layer on the SOI, and further comprises:

Step 1: forming an opening exposing SOI bottom silicon using photo lithography and etching;

Step 2: wet etching the SOI oxide layer through the opening;

Step 3: depositing a polysilicon layer at the opening followed by anisotropic dry etching;

Step 4: depositing an insulating dielectric layer at the opening followed by planarization processing;

Step 5: forming a gate stack structure by deposition and etching, and forming source/drain junctions of the transistor using ion implantation.

Preferably, the gate stack structure described in Step 5 covers the opening.

Preferably, Step 2 in one embodiment includes isotropically etching the SOI oxide layer using a hydrofluoric acid, causing lateral etching of the SOI oxide layer, where a lateral etching distance can be controlled by etching time.

Preferably, the lateral etching distance is less than a length of a gate electrode of the transistor.

Preferably, the insulating dielectric layer deposited in step 4 is a silicon dioxide layer, and the planarization processing of the insulating dielectric layer is performed using a chemical mechanical polishing or etching process.

Preferably, the gate stack structure in Step 5 has a rectangular shape.

Preferably, the gate stack structure in step 5 is a T-shaped structure. In one embodiment, at the first structure, a T-shaped gate stack structure is made of a horizontal rectangle added to a longitudinal rectangle.

In addition, the present invention also proposes an integrated circuit chip, including at least one semiconductor device having the SOI transistor structure.

Compared with conventional SOI transistor structures, the present invention are has the following advantages:

The structure illustrated by the present disclosure effectively forms body contact for the SOI field-effect transistor, thereby eliminating the floating-body effect in the SOI field-effect transistor.

The structure illustrated by the present disclosure causes the body region of the SOI field-effect transistor to have contact with a bottom silicon substrate of the SOI substrate, thereby improving the heat-dissipation capacity of the SOI transistor and associated integrated circuit.

The structure and the method of making the structure illustrated by the present disclosure causes the body region the SOI field-effect transistor to have contact with the bottom silicon substrate of the SOI substrate, maximizing use of the area of the substrate, and enhancing the degree of chip integration.

DETAILED DESCRIPTION OF THE EMBODIMENTS

Figure 17:
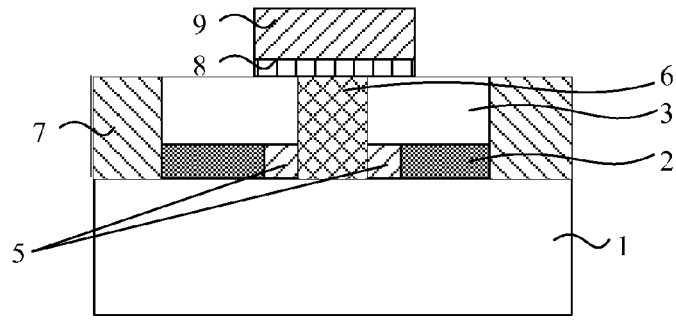
FIG. 17 is a cross-sectional view along the AA' direction in the structure illustrated in FIG. 16.

The present invention proposes a body-contact SOI transistor structure, as shown in FIG. 17, including: a first structure filled with an insulating dielectric material 6 after an upper silicon layer 3 of the SOI and an oxide layer 2 of the SOI are etched; and a polysilicon layer 5 in the oxide layer 2 near the first structure, the polysilicon layer 5 connecting the upper silicon layer 3 of the SOI with the bottom silicon 1 of the SOI.

Figure 16:
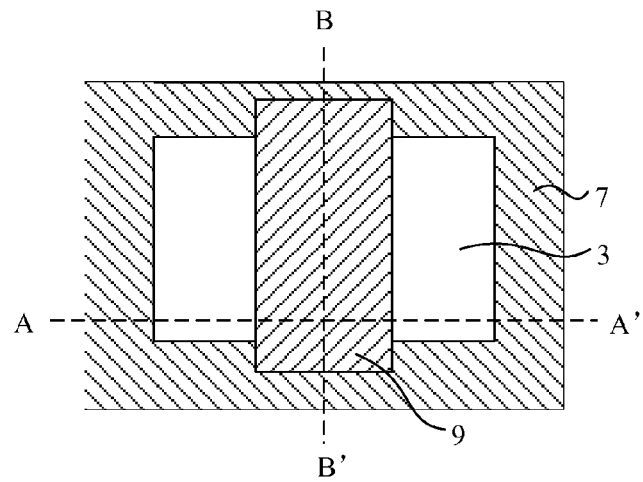
FIG. 16 is a first plan view of the structure illustrated in FIG. 15 after etching the gate conductor layer and the gate insulator layer.

The SOI transistor structure further includes a rectangular gate stack structure on a surface of the SOI, as shown in FIGS. 16 and 17. The rectangular gate stack structure including a rectangular gate insulator layer 8 and a rectangular gate conductor layer 9.

Figure 18:
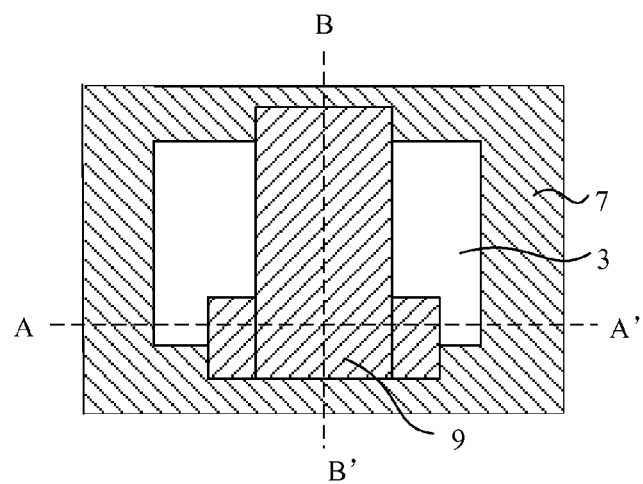
FIG. 18 is a second plan view of the structure illustrated in FIG. 15 afer etching the gate conductor layer and the gate insulator layer.
Figure 19:
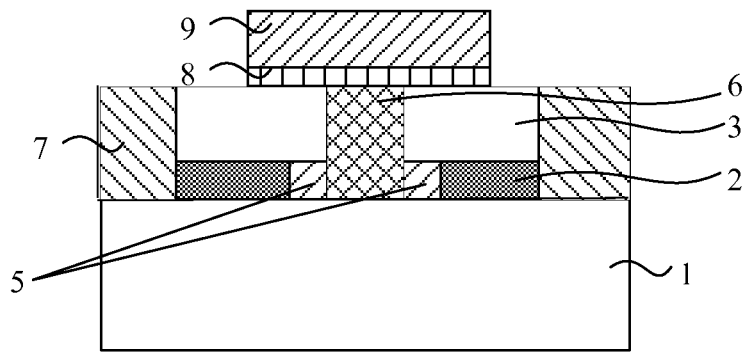
FIG. 19 is a cross-sectional view along the AA' direction in the structure illustrated in FIG. 18.

The SOI transistor structure further includes a T-shaped gate stack structure on the surface of the SOI, as shown in FIGS. 18 and 19. In one embodiment, at the first structure, the T-shaped gate stack structure is made of a rectangle along the AA' direction in addition to a rectangle along the BB' direction. The T-shaped gate stack structure includes a T-shaped gate insulator layer 8 and a T-shaped gate conductor layer 9.

Further, the present invention also proposes an integrated circuit chip, including at least one semiconductor device having the SOI transistor structure.

Figure 20:
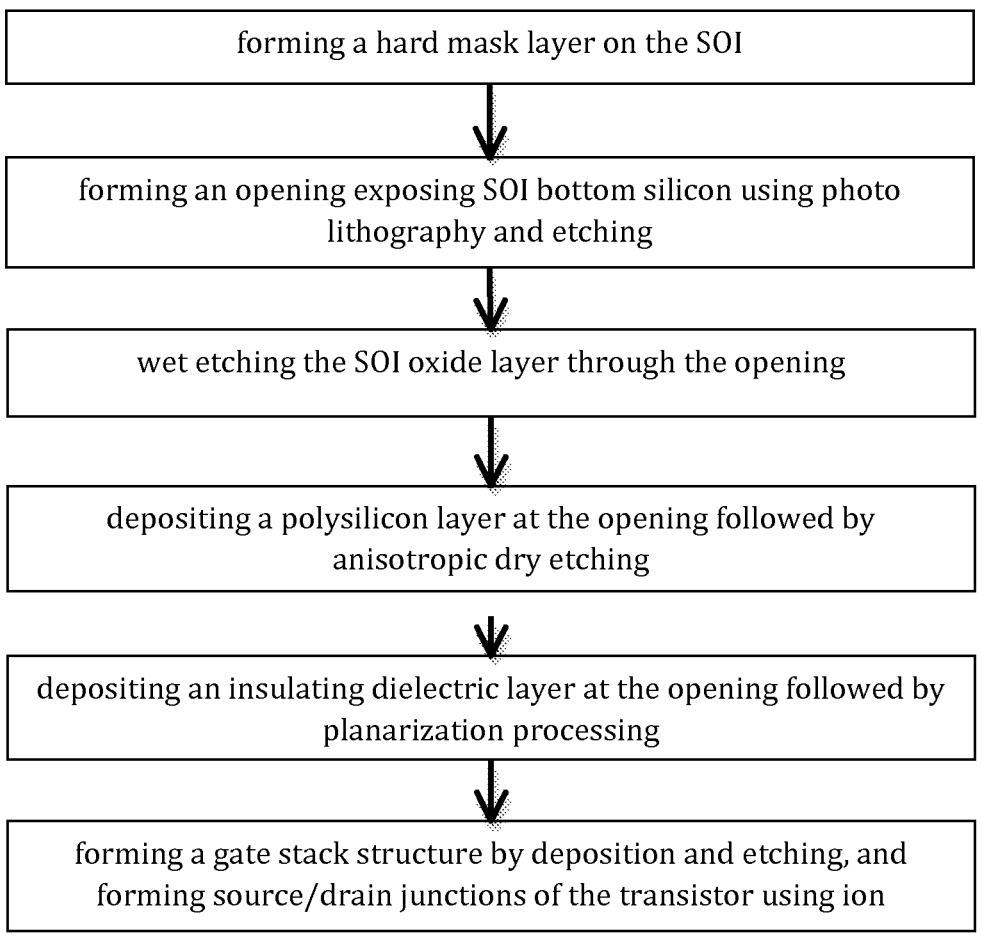
FIG. 20 is a flow chart illustrating a method of making a SOI transistor structure according to embodiments of the present invention.

Further, the present invention also proposes a method for making a body-contact SOI transistor structure. As shown in FIG. 20, the method comprises forming a hard mask layer on an SOI substrate, and further comprises:

Step 1: forming an opening exposing bottom silicon of the SOI using photolithography and etching;

Step 2: wet etching an oxide layer of the SOI through the opening;

Step 3: depositing a polysilicon layer at the opening followed by anisotropic dry etching;

Step 4: depositing an insulating dielectric layer at the opening followed by planarization processing;

Step 5: forming a gate stack structure by deposition and etching, and forming source/drain junctions of the transistor using ion implantation.

The above method is explained in more specificity below.

Example 1

This exemplary embodiment includes the process steps illustrated in FIGS. 1-17.

Figure 1:
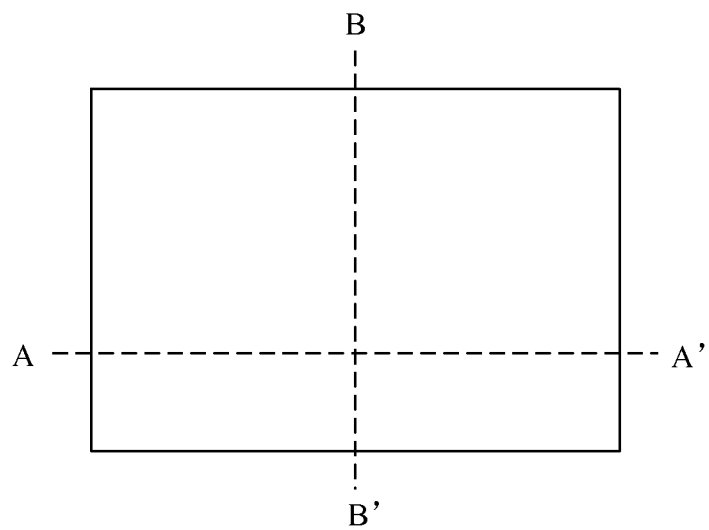
FIG. 1 is a plan view of a SOI substrate.
Figure 2:
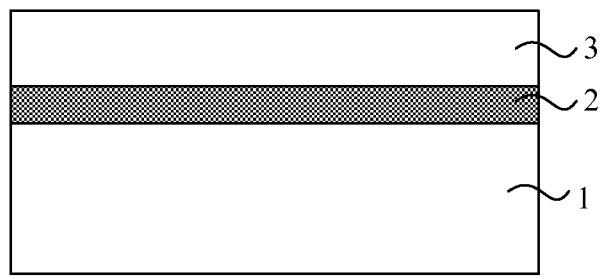
FIG. 2 is a cross-sectional view of the SOI substrate illustrated in FIG. 1 in AA' direction.

Step 1: providing a silicon-on-insulator (SOI) substrate, as shown in FIGS. 1 and 2. The SOI substrate includes a SOI bottom silicon 1, a SOI oxide layer 2 and a SOI upper silicon 3.

Figure 3:
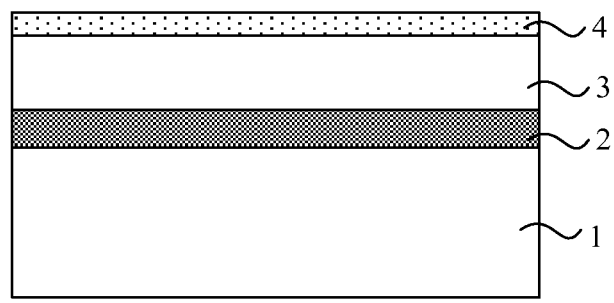
FIG. 3 is a cross-sectional view in the AA' direction after depositing a hard mask layer on the structure shown in FIG. 2.

Step 2: forming a hard mask layer 4 on the SOI substrate, as shown in FIG. 3. The hard mask layer 4 can be an insulating dielectric layer, which can include the following materials: silicon nitride ($Si_3N_4$), silicon dioxide ($SiO_2$), or a multilayer structure formed of silicon nitride and silicon dioxide.

Figure 4:
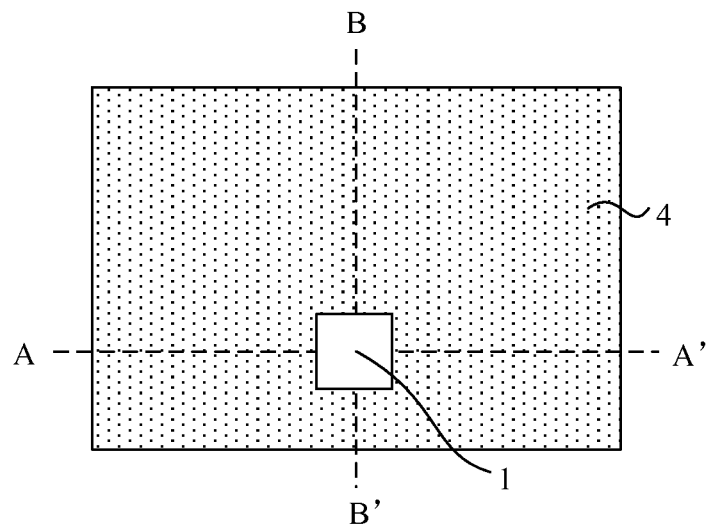
FIG. 4 is a plan view after forming an opening in the structure illustrated in FIG. 3 using photolithography and etching processes.
Figure 5:
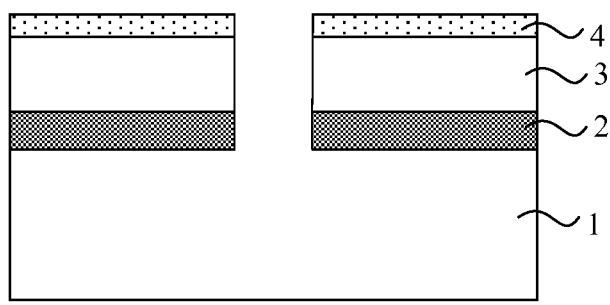
FIG. 5 is a cross-sectional view along the AA' direction of FIG. 4.

Step 3, forming an opening, as shown in FIGS. 4 and 5, using photolithography, etching, etc. During the etching process, the hard mask layer 4, the SOI upper silicon layer 3 and the SOI oxide layer 2 are removed to expose the SOI bottom silicon 1.

Figure 6:
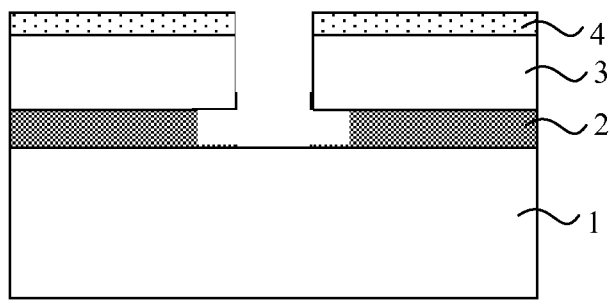
FIG. 6 is a cross-sectional view along the AA' direction of the structure shown in FIG. 5 after wet etching the SOI oxide.

Step 4: wet etching the SOI oxide layer 2 through the opening. For example, the SOI oxide layer 2 can be etched isotropically using a solution containing hydrofluoric acid (HF), so that the SOI oxide layer 2 is etched laterally, with a laterally etched distance controllable by controlling the etch time. The formed structure is shown in FIG. 6.

Figure 7:
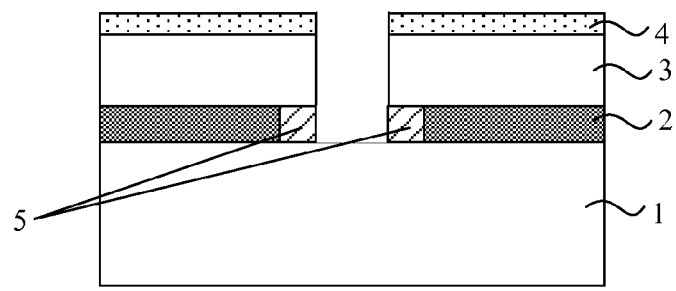
FIG. 7 is a cross-sectional view along the AA' direction in the structure shown in FIG. 6, after depositing and anisotropic dry etching a polysilicon layer.

Step 5: depositing a polysilicon layer 5 followed by anisotropic dry etching. After the polysilicon layer 5 is anisotropically etched, the remaining polysilicon layer 5 connects the SOI upper silicon 3 and the SOI bottom silicon 1, as shown in FIG. 7.

Figure 8:
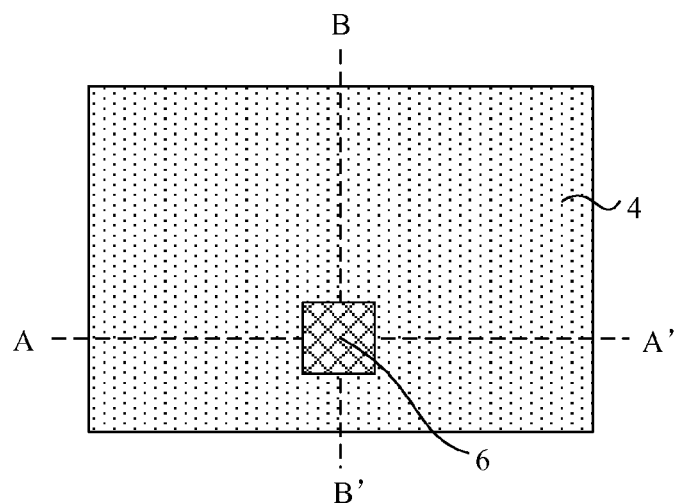
FIG. 8 is a plan view of the structure shown in FIG. 7 after depositing and planarizing a dielectric layer.
Figure 9:
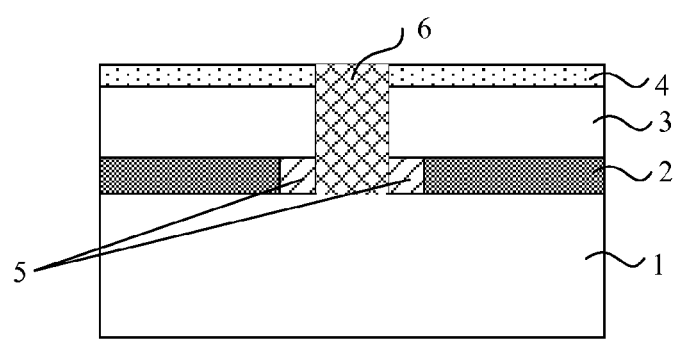
FIG. 9 is a cross-sectional view along the AA' direction in FIG. 8.

Step 6: depositing an insulating dielectric layer 6 followed by planarization The deposited insulating dielectric layer 6 can generally be silicon dioxide. The dielectric layer is planarized. Generally, a chemical mechanical polishing (CMP) or etching process can be used. The resulting structure is shown in FIGS. 8 and 9.

Figure 10:
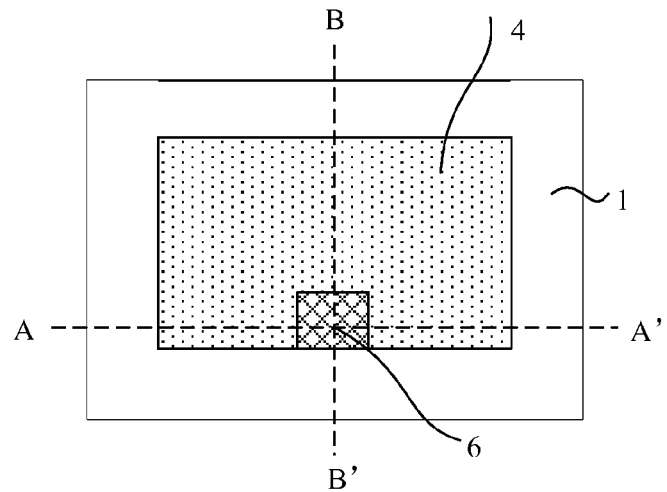
FIG. 10 is a plan view of the structure shown in FIG. 9 after areas around an active region is etched out.
Figure 11:
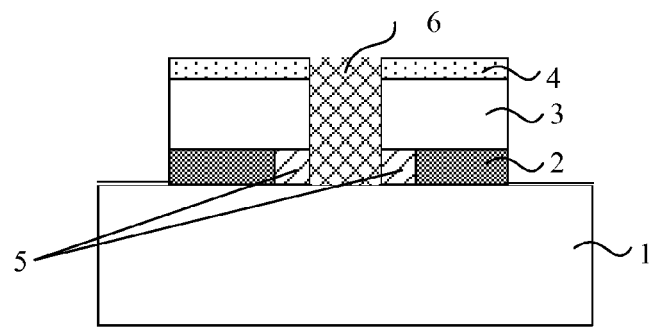
FIG. 11 is a cross-sectional view along the AA' direction of FIG. 10.
Figure 12:
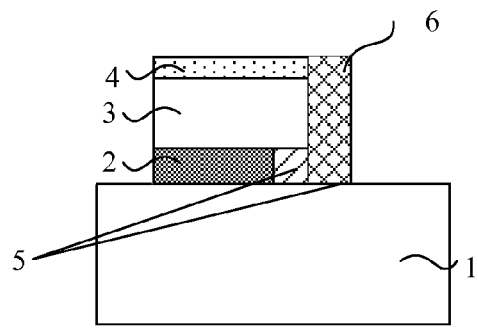
FIG. 12 is a cross-sectional view along a BB' direction of FIG. 10.

Step 7: using photolithography, etching processes to define active areas. An active area is shown as area 4 in FIG. 10. An area around the active area is removed by etching, such as the area around area 4 in FIG. 10. An etched depth is reached to expose the SOI bottom silicon outside the active area 4. So, the hard mask layer 4, the SOI upper silicon 3, and the SOI oxide layer 3 in the structure around the active area, and the dielectric layer 6 in the opening are removed by the etching process, as shown in FIGS. 10, 11, and 12.

Figure 13:
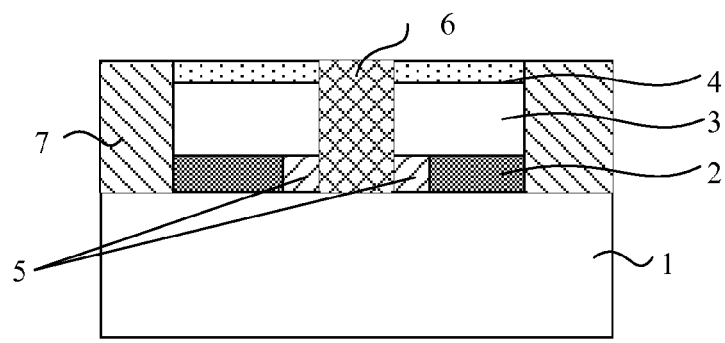
FIG. 13 is a cross-sectional view along the AA' direction after a dielectric layer is deposited on the structure and planarized.

Step 8: depositing a dielectric layer 7 around the etched-out active region, i.e., on the SOI bottom silicon 1. As in Step 6, the deposited material can be silicon dioxide, as shown in FIG. 13.

Figure 14:
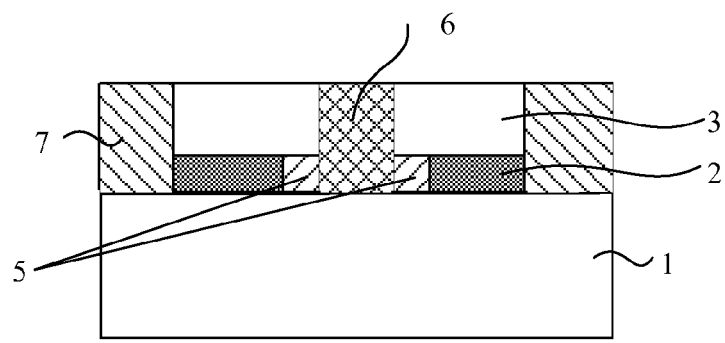
FIG. 14 is a cross-sectional view along the AA' direction of the structure shown in FIG. 13 after removing the hard mask layer on the SOI surface by etching.

Step 9: removing by etching the hard mask layer 4 and the dielectric layer 6 on the SOI surface, exposing the SOI upper silicon 3, as shown in FIG. 14.

Figure 15:
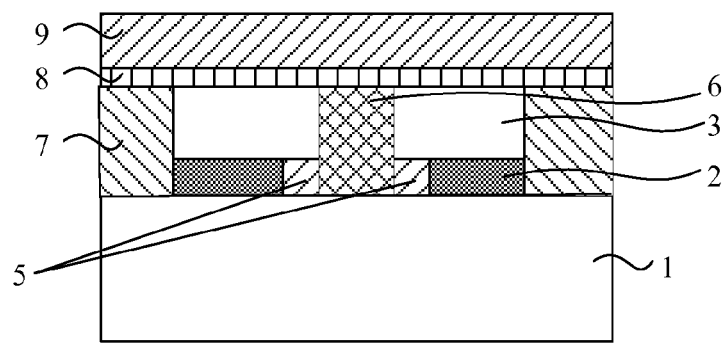
FIG. 15 is a cross-sectional view along the AA' direction after depositing a gate insulator layer and gate conductor layer on the structure shown in FIG. 14.

Step 10: forming a gate stack by deposition, including the gate insulator layer 8 and the gate conductor layer 9, as shown in FIG. 15. The gate insulator layer 8 can be silicon dioxide, silicon nitride, a high-K dielectric containing zirconium, or a mixture thereof. The gate conductor layer 9 can be polysilicon, metal, or a multi-layer structure formed thereof. The metal can be TiN, TaN.

Step 11: performing photolithography and patterned etching on the gate conductor layer 9 and the gate insulator layer 8. A rectangular gate electrode of the field-effect transistor formed after etching the gate conductor layer 9 and the gate dielectric layer 8 is shown in FIGS. 16 and 17.

Step 12: performing conventional CMOS processes, including performing implanting ions into the SOI upper silicon 3 on two sides of the gate electrode to form the source/drain of the transistor. Because self-aligned processes are used, the SOI upper silicon 3 under the gate electrode forms the body region of the transistor.

Thus, the polysilicon layer 5 formed in step 5 connects the body region, i.e., the SOI upper silicon 3 under the gate electrode, and the SOI bottom silicon 1, thereby avoiding the floating-body effect usually associated with SOI field-effect transistors.

Example 2

Besides Step 11, other steps are identical to the corresponding steps in Example 1. In this exemplary method, step 11 forms a gate electrode of a different shape, as shown in FIGS. 18 and 19. The gate electrode of such a shape has the advantages of increased processing windows for forming the body contact, and increased body contact area. By body contact, the SOI upper silicon 3 is connected to the SOI bottom silicon 1 via the polysilicon 5, the SOI upper silicon 3 under the gate electrode 9 being the body region. Compared to FIG. 16, the gate electrode in FIG. 18 has an increased area, and the SOI upper silicon 3 covered by the gate electrode, i.e., the body region, has an increased area. Thus, the SOI upper silicon 3 can have better contact with the bottom silicon 1.

Using the structure and the method provided by the present invention, effective body contact in SOI field-effect transistors can be formed, eliminating the floating-body effect in the SOI field-effect transistors and improving heat dissipation capabilities of the SOI transistors and associated integrated circuits. At the same time, usage of the substrate area can be maximized, enhancing the degree of integration for the chips.

Obviously, the present invention can have many other embodiments. Without departing from the spirit and essence of the present invention, those skilled in the art can make certain corresponding changes and modifications based on the present disclosure, all of which should be included in the scope of protection afforded by the appended claims.

We claim:

1. A method of making a body-contact SOI transistor structure on a silicon-on-insulator (SOI) substrate, the SOI substrate including upper silicon on an insulator layer on bottom silicon, the method comprising:
    forming an opening through the upper silicon and the insulator layer, the opening exposing the bottom silicon;
    laterally etching the insulator layer underneath the upper silicon through the opening to create recessed regions in the opening underneath the upper silicon;
    filling the recessed regions with a polysilicon layer such that the polysilicon layer connects the upper silicon and the bottom silicon;
    filling the opening with an insulating dielectric layer;
    forming a gate stack over the SOI substrate, the gate stack having a first portion covering the opening and a second portion extending from the first portion and covering an area of the upper silicon across a middle portion of an active region of the body-contact SOI transistor; and
    forming source/drain junctions of the body-contact SOI transistor structure on opposite sides of the gate stack using self-aligned processes such that one of the source/drain junctions is on a first side of the opening while the other one of the source/drain junctions is on a second side of the opening opposite to the first side of the opening.

2. The method of making the SOI transistor structure according to claim 1, wherein filling the recessed regions with a polysilicon layer comprises depositing polysilicon over the SOI substrate and anisotropically etching the polysilicon to form the polysilicon layer filling the recessed regions.

3. The method of making the SOI transistor structure according to claim 1, wherein laterally etching the insulator layer comprises using an isotropic etching process to etch the insulator layer.

4. The method of making the SOI transistor structure according to claim 3, wherein laterally etching the insulator layer comprises controlling an etching time of the isotropic etching process so that a lateral etching distance for each of the recessed regions is less than a length of a gate electrode of the transistor.

5. The method of making the SOI transistor structure according to claim 1, wherein the insulating dielectric layer is a silicon dioxide layer, wherein filling the opening with an insulating dielectric layer comprises depositing a silicon dioxide layer over the SOI substrate and planarizing the silicon dioxide layer.

6. The method of making the SOI transistor structure according to claim 1, wherein the gate stack has a rectangular shape.

7. The method of making the SOI transistor structure according to claim 1, wherein the first portion of the gate stack and the second portion of the gate stack together form a T-shaped structure, and wherein the first portion forms a horizontal rectangle of the T-shaped structure while the second portion forms a longitudinal rectangle of the T-shaped structure.

8. The method of making the SOI transistor structure according to claim 1, wherein the recessed regions include at least two recessed regions on at least two sides of the opening, and each recessed region is between the upper silicon and the bottom silicon.

9. The method of making the SOI transistor structure according to claim 1, wherein laterally etching the insulator layer comprises wet etching the insulator layer through the opening by using a solution containing hydrofluoric acid.

10. The method of making the SOI transistor structure according to claim 2, wherein the polysilicon layer is between the upper silicon and the bottom silicon.

11. The method of making the SOI transistor structure according to claim 1, further comprises:
    forming a mask layer over an active area; wherein the opening occupies a portion of the active area near an edge of the active area;
    removing portions of the upper silicon and the insulator layer around the active area to expose the bottom silicon outside the active area; and
    deposit a dielectric layer around the active area.

12. The method of making the SOI transistor structure according to claim 11, further comprises removing the mask layer and a portion of the dielectric layer in the opening.

13. The method of making the SOI transistor structure according to claim 1, wherein the gate stack covers a middle part of the active area outside of the opening.

14. The method of making the SOI transistor structure according to claim 13, wherein forming the source/drain junctions comprises implanting ions into the upper silicon on two sides of the gate stack, thereby forming source and drain of the SOI transistor structure on the two sides of the gate stack and a body region in the upper silicon under the gate stack.

15. The method of making the SOI transistor structure according to claim 14, wherein the gate stack is T-shaped thereby allowing an increased body contact area without increasing a length of a gate electrode of the SOI transistor structure, wherein the first portion of the gate stack forms a horizontal rectangle of the T-shaped structure while the second portion of the gate stack forms a longitudinal rectangle of the T-shaped structure.

16. A transistor structure formed on a silicon-on-insulator (Soi) substrate, the SOI substrate including upper silicon on an insulator layer on bottom silicon, the transistor structure comprising:
- an opening through the upper silicon and the insulator layer;
- recessed regions in the opening between the upper silicon and the bottom silicon, the recessed regions being formed by removing portions of the insulator layer underneath the upper silicon near the opening;
- a polysilicon layer filling the recessed regions such that the polysilicon layer connects the upper silicon and the bottom silicon;
- an insulating dielectric layer filling the opening;
- a gate stack over the SOI substrate, the gate stack having a first portion covering the insulating dielectric layer in the opening and a second portion extending from the first portion and covering an area of the upper silicon across a middle portion of an active region of the body-contact SOI transistor; and
- source/drain junctions formed using self-aligned processes on opposite sides of the gate stack, wherein one of the source/drain junctions is on a first side of the opening while the other one of the source/drain junctions is on a second side of the opening opposite to the first side of the opening.

17. The transistor structure formed on the SOI substrate according to claim 16, wherein a lateral distance for each of the recessed regions is less than a length of a gate electrode of the transistor structure.

18. The transistor structure formed on the SOI substrate according to claim 16, wherein the gate stack covers a middle part of the active area, and wherein the opening occupies a portion of the middle part of the active area.

19. The transistor structure formed on the SOI substrate according to claim 16, wherein the gate stack is a T-shaped structure, thereby allowing an increased body contact area without increasing a length of a gate electrode of the SOI transistor structure, wherein the first portion of the gate stack forms a horizontal rectangle of the T-shaped structure while the second portion of the gate stack forms a longitudinal rectangle of the T-shaped structure.

20. The transistor structure formed on the SOI substrate according to claim 16, further comprising a body region in the upper silicon under the gate stack.

* * * * *